(12) United States Patent
Takashige et al.

(10) Patent No.: US 8,475,003 B2
(45) Date of Patent: Jul. 2, 2013

(54) LENS BODY, LIGHT SOURCE UNIT AND LIGHTING SYSTEM

(75) Inventors: Yutaka Takashige, Osaka (JP); Fumio Kokubo, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 327 days.

(21) Appl. No.: 12/989,352

(22) PCT Filed: Feb. 27, 2009

(86) PCT No.: PCT/JP2009/053743
§ 371 (c)(1),
(2), (4) Date: Oct. 22, 2010

(87) PCT Pub. No.: WO2009/130944
PCT Pub. Date: Oct. 29, 2009

(65) Prior Publication Data
US 2011/0032707 A1    Feb. 10, 2011

(30) Foreign Application Priority Data

Apr. 25, 2008   (JP) .................................. 2008-116080

(51) Int. Cl.
*F21S 8/00* (2006.01)
(52) U.S. Cl.
USPC ......................................... 362/277; 362/257
(58) Field of Classification Search
USPC .................. 362/277, 257, 273, 289
See application file for complete search history.

(56) References Cited

U.S. PATENT DOCUMENTS

| 4,479,686 A | 10/1984 | Hoshino et al. |
| 4,529,268 A | 7/1985 | Brown |
| 4,703,334 A | 10/1987 | Mochimaru et al. |
| 6,122,114 A | 9/2000 | Sudo et al. |
| 2005/0046950 A1 | 3/2005 | Baek et al. |

FOREIGN PATENT DOCUMENTS

| JP | 55-54977 | 4/1980 |
| JP | 55-37870 | 9/1980 |
| JP | 60-53556 U | 4/1985 |
| JP | 60-136171 | 9/1985 |
| JP | 61-186916 A | 8/1986 |
| JP | 63-81992 A | 4/1988 |
| JP | 63-265664 A | 11/1988 |
| JP | 2-31179 | 2/1990 |
| JP | 9-197236 A | 7/1997 |

(Continued)

OTHER PUBLICATIONS

Japanese Office Action dated Apr. 5, 2011 with partial English translation.

(Continued)

*Primary Examiner* — Evan Dzierzynski
(74) *Attorney, Agent, or Firm* — Birch, Stewart, Kolasch & Birch, LLP

(57) ABSTRACT

Substantially cylindrical supporting units are formed at both sides of a lens. The supporting units are to adjust the separation distance between the lens and the surface of a substrate depending on the height dimension of a light emitting diode mounted on the substrate from the substrate face when the lens body is fixed to the substrate. A cylindrical convex part is formed at a part of the tip face of the supporting unit in a concentric fashion relative to the supporting unit, and a cylindrical positioning unit is formed at a part of the tip face of the convex part in a concentric fashion. The positioning unit functions as a member for positioning when the substrate and the lens body are fixed to each other.

18 Claims, 19 Drawing Sheets

FOREIGN PATENT DOCUMENTS

| | | |
|---|---|---|
| JP | 10-160996 A | 6/1998 |
| JP | 2004-355934 A | 12/2004 |
| JP | 2007-150255 A | 6/2007 |
| KR | 100 824 998 B1 | 4/2008 |

OTHER PUBLICATIONS

International Search Report, dated Apr. 7, 2009, issued in PCT/JP2009/053743.

European Search Report mailed Feb. 9, 2012.

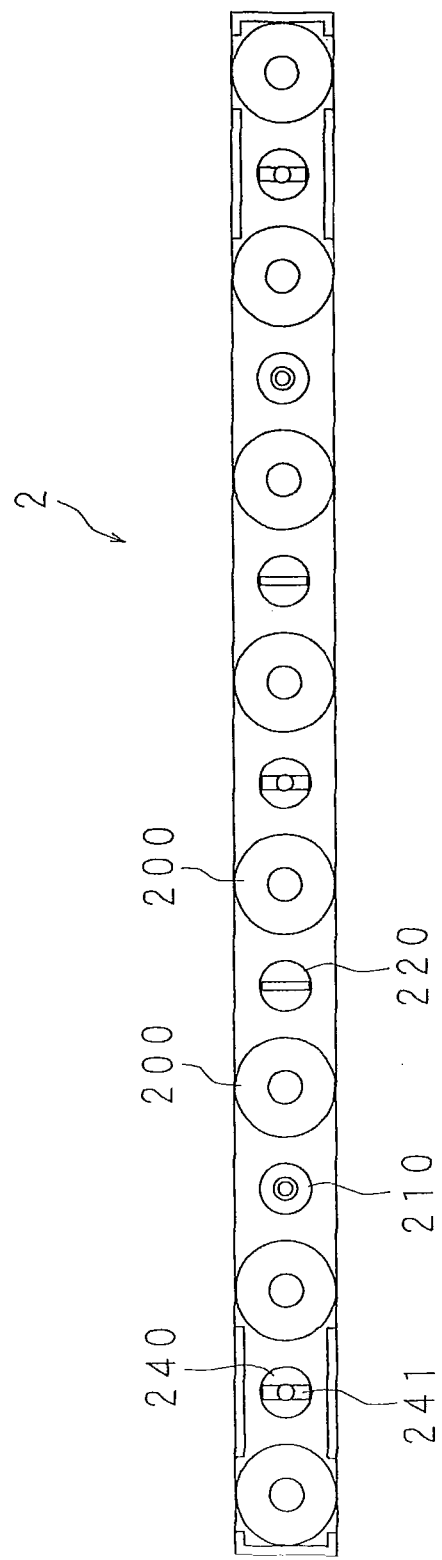

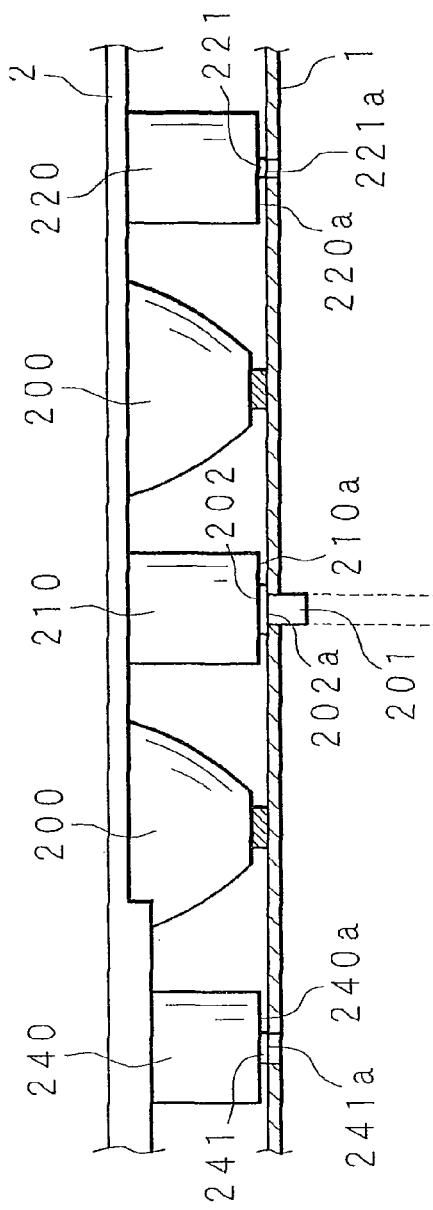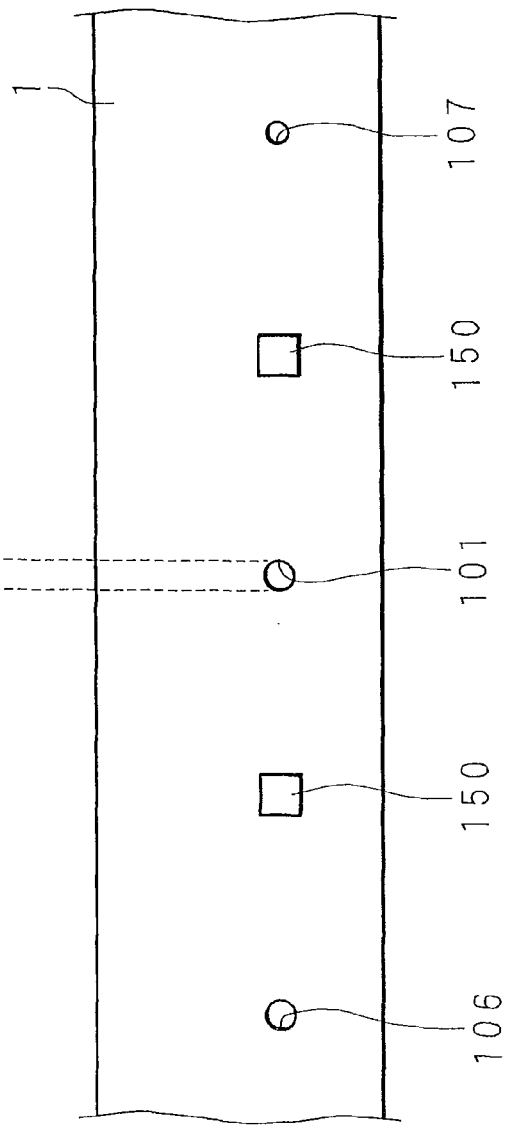

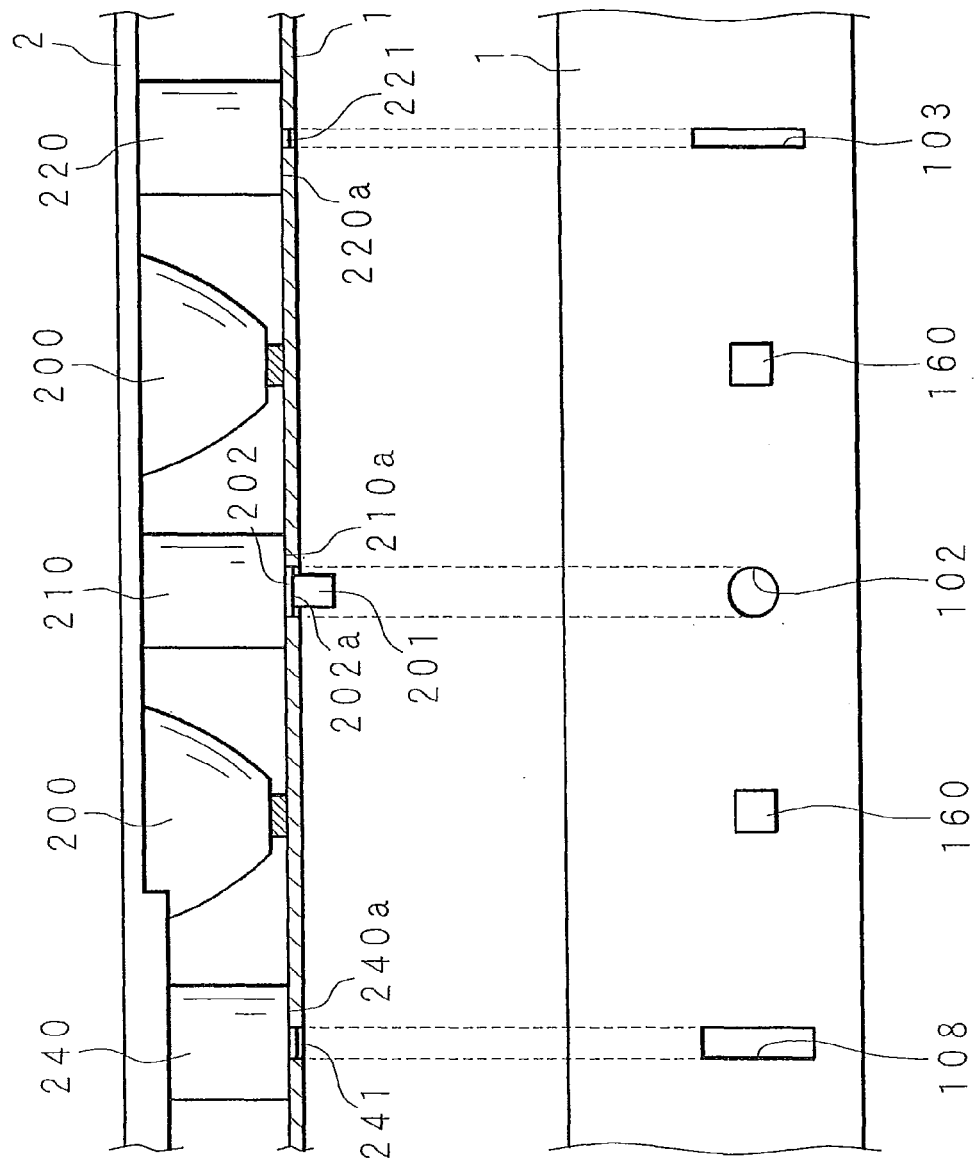

LENS BODY, LIGHT SOURCE UNIT AND LIGHTING SYSTEM

This application is the normal phase under 35 U.S.C. §371 of PCT International Application No. PCT/JP2009/053743 which has an International filing date of Feb. 27, 2009 and designated the United States of America.

BACKGROUND

1. Technical Field

The present invention relates to: a lens body provided with a lens for condensing light from a light source; a light source unit provided with the lens body; and a lighting system provided with the light source unit.

2. Description of Related Art

In recent years, a light emitting diode having a power-saving feature and a long-life feature has received attention as a light source for lighting, a lighting system using a light emitting diode has come into wider use in various fields, and lighting systems suitable for respective intended applications have been developed.

For example, there is a lighting system provided with a lens for condensing light from a light emitting diode mounted on a substrate and emitting condensed light in a predetermined direction (see Japanese Patent Application Laid-Open No. 2007-150255).

SUMMARY

In general, each lighting system uses a light emitting diode having a different luminous output depending on the intended application, specification, rated power or the like of the lighting system. Since a light emitting diode having a different luminous output also has a different shape or a different size, it is required to use a different condenser lens depending on the shape, size or the like of the light emitting diode in order to emit light from the light emitting diode in a predetermined direction. On the other hand, since a condenser lens is expensive and especially a lighting system having a number of light emitting diodes mounted on a substrate requires lenses, the number of which corresponds to the number of the light emitting diodes, cost rise of the entire system has been caused and cost reduction has been awaited.

The present invention has been made in view of such circumstances, and the object thereof is to provide: a lens body, which can reduce the cost by sharing a lens; a light source unit provided with the lens body; and a lighting system provided with the light source unit.

A lens body according to the present invention is a lens body having a lens for condensing light from a light source wherein the lens is attached to face a predetermined face, characterized by comprising an adjusting unit for adjusting an attachment interval between the predetermined face and the lens.

A lens body according to the present invention is a lens body having a lens for condensing light from a light source wherein the lens is attached to face a predetermined face, characterized by comprising an adjusting unit capable of maintaining an equal interval between the lens and the light source by adjusting an attachment interval between the predetermined face and the lens depending on a type of the light source.

A lens body according to the present invention is characterized in that the adjusting unit comprises: a supporting unit to be in contact with the predetermined face for supporting the lens; and a plurality of contacting faces having a step, which are provided at the supporting unit.

A lens body according to the present invention is characterized in that the adjusting unit comprises: a convex part formed at a part of a first contacting face; and a second contacting face formed at a tip face of the convex part.

A lens body according to the present invention is characterized in that the adjusting unit comprises a positioning unit, which is provided at a part of the second contacting face, for determining a location of the lens.

A lens body according to the present invention is characterized in that the lens and the adjusting unit are formed in an integrated fashion.

A light source unit according to the present invention is characterized by comprising: a lens body according to any one of the inventions described above; and a substrate, on which a light emitting device is mounted, wherein the adjusting unit is constructed to adjust an attachment interval between the lens and the substrate face, which functions as the predetermined face.

A light source unit according to the present invention is characterized in that the adjusting unit is constructed to adjust a separation distance between the lens and the surface of the light emitting device to be substantially constant relative to each substrate, on which the light emitting device having a different height is mounted.

A light source unit according to the present invention is characterized in that the substrate comprises a fit part to be fitted with any one of the convex part and the positioning unit depending on a height of the light emitting device mounted on the substrate.

A light source unit according to the present invention is a light source unit comprising a substrate, on which a light emitting device is mounted, and a lens for condensing light from the light emitting device, characterized in that the substrate comprises an adjusting member for adjusting a separation distance between the lens and the surface of the light emitting device to be substantially constant regardless of a height of the light emitting device.

A lighting system according to the present invention is characterized by comprising a light source unit according to any one of the inventions described above.

In the present invention, when a lens is attached to face a predetermined face (e.g., an installation face where a light source is installed), the attachment interval between the predetermined face and the lens is adjusted. Consequently, it is possible to maintain a substantially equal separation distance between the lens and the light source by adjusting the interval between the lens and the installation face and to emit light from the light source always in a predetermined direction, even when the height of each light source from the installation face is different, for example. There is therefore no need to use a different lens body depending on the shape or size of each light source, and it is possible to use a common lens body regardless of the shape or size of a light source and to reduce the cost.

In the present invention, when a lens is attached to face a predetermined face (e.g., an installation face where a light source is installed), the attachment interval between the predetermined face and the lens is adjusted so as to maintain an equal interval between the lens and the light source depending on the type of the light source. Consequently, it is possible to maintain an equal interval between the lens and the light source by adjusting the interval between the lens and the installation face and to emit light from the light source always in a predetermined direction, even when the height of each light source from the installation face is different depending on the type of the light source, for example. There is therefore no need to use a different lens body depending on the shape or size of each light source, and it is possible to use a common lens body regardless of the shape or size of a light source and to reduce the cost.

In the present invention, when a supporting unit comes into contact with a predetermined face (e.g., an installation face where a light source is installed) and supports a lens, the attachment interval between the predetermined face and the lens can be adjusted by using a plurality of different contacting faces having a step. For example, the attachment interval between the installation face and the lens can be lengthened when a contacting face having a higher step comes into contact with the installation face, while the attachment interval between the installation face and the lens can be shortened when a contacting face having a lower step comes into contact with the installation face.

In the present invention, a convex part is formed at a part of a first contacting face, and a second contacting face is formed at the tip face of the convex part. That is, the first contacting face is a contacting face having a lower step, and the second contacting face is a contacting face having a higher step. Consequently, it is possible to adjust the interval between the lens and the installation face so as to maintain a substantially equal separation distance between the lens and the light source by: bringing the first contacting face into contact with the installation face when the height of the light source from the installation face is small; or bringing the second contacting face into contact with the installation face when the height of the light source from the installation face is large.

In the present invention, a positioning unit for determining the location of a lens is provided at a part of the second contacting face. Consequently, it is possible to determine the positions of the light source and the lens with a high degree of accuracy.

In the present invention, a lens body provided with a lens is formed in an integrated fashion. Consequently, there is no need to assemble a lens body, and it is possible to reduce the cost by skipping an assembly process.

In the present invention, the attachment interval between a lens and a substrate, on which a light emitting device (e.g., a light emitting diode) is mounted, is adjusted. Consequently, it is possible to adjust the attachment interval between the substrate and the lens even when each substrate, on which a light emitting device having a different shape or a different size depending on the luminous output of the light emitting device is mounted, is used. It is therefore possible to use a common lens body and to reduce the cost.

In the present invention, it is possible to emit light always in an intended direction regardless of the type of the light emitting device, by adjusting the separation distance between the lens and the surface of the light emitting device to be substantially constant relative to each substrate, on which a light emitting device having a different height is mounted.

In the present invention wherein the substrate is provided with a fit part to be fitted with any one of the convex part and the positioning unit depending on the height of a mounted light emitting device, it is possible to use a common lens body and to reduce the cost.

In the present invention wherein an adjusting member for adjusting the separation distance between the lens and the surface of the light emitting device to be substantially constant regardless of the height of a mounted light emitting device is provided at the substrate side, there is no need to use a different lens body depending on the shape or size of each light emitting device, and it is possible to use a common lens body regardless of the shape or size of a light emitting device and to reduce the cost.

In the present invention, it is possible to provide a lighting system, which can use a common lens body regardless of the shape or size of a light emitting device (a light source), reduce the cost, and emit light always in an intended direction.

With the present invention, it is possible to use a common lens body regardless of the shape or size of a light emitting device (a light source) and to reduce the cost.

The above and further objects and features of the invention will more fully be apparent from the following detailed description with accompanying drawings.

BRIEF DESCRIPTION OF THE SEVERAL VIEWS OF THE DRAWINGS

FIG. 4 is a bottom view of a lens body;

FIGS. 15A and 15B are an explanatory diagram for illustrating a state where a lens body of Embodiment 3 is fixed to a substrate;

FIGS. 16A and 16B are an explanatory diagram for illustrating a state where a lens body of Embodiment 3 is fixed to a substrate;

DETAILED DESCRIPTION

Embodiment 1

Figure 1:
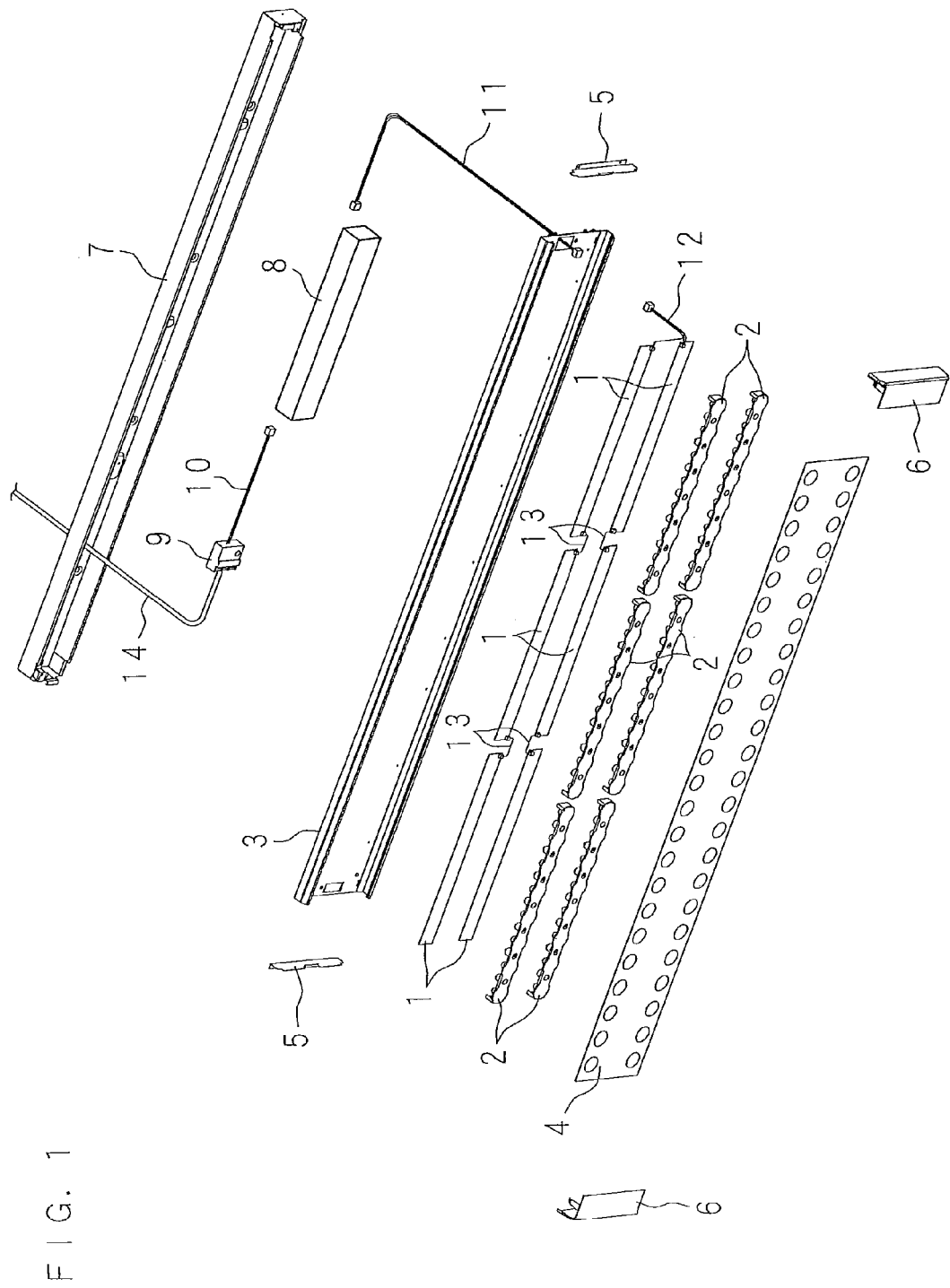
FIG. 1 is an exploded perspective view of a lighting system according to the present invention.

The following description will explain the present invention with reference to the drawings illustrating some embodiments thereof. FIG. 1 is an exploded perspective view of a lighting system according to the present invention. Denoted at 1 in FIG. 1 is a substrate, on which light emitting diodes (not illustrated) are mounted at an appropriate distance from each other. Three rectangular substrates 1 in the longer direction and two rectangular substrates 1 in the shorter direction, that is, six rectangular substrates 1 in total are provided in the example illustrated in FIG. 1, though the number of substrates 1 is not limited. Moreover, each substrate 1 is fixed to a radiator frame 3, which is made of aluminum, via an insulating sheet (not illustrated), though an insulating sheet is not essential. The respective substrates 1 are connected electrically with each other by a harness 13.

A lens body 2 having a dimension substantially equal to that of the substrate 1 is fixed to face a surface (a face where light emitting diodes are mounted) of each substrate 1. The lens body 2 is made of, for example, transparent acrylic resin and is provided with a lens, which has a substantially spherical convex shape, corresponding to the mounting position of each light emitting diode. Each lens condenses light to be emitted from a light emitting diode and emits condensed light in a predetermined direction. It is to be noted that a detailed explanation of the lens body 2 will be given later.

A transparent cover 4 is fixed to the surface side (opposite to the substrate 1) of the lens body 2 to be sandwiched with side plates 5 and 5 fixed to the respective end parts of the radiator frame 3, and side covers 6 and 6 are further fitted with both ends of the cover 4 so as to make up a light source unit. That is, a light source unit comprises at least the substrate 1, on which the light emitting diode is mounted, and the lens body 2.

A box-shaped lighting system housing 7, which holds a power supply unit 8, is fixed to the rear side (opposite to the substrate 1) of the radiator frame 3, and a terminal block 9 attached to the lighting system housing 7 is connected with a power wire 14 extending from a commercial power supply. A harness 10 is connected between the terminal block 9 and the power supply unit 8, so that voltage of AC 100V or AC 200V, for example, is applied to the power supply unit 8. Voltage (e.g., DC voltage) converted by the power supply unit 8 is supplied to the respective substrates 1 by harnesses 11 and 12.

Figure 2:
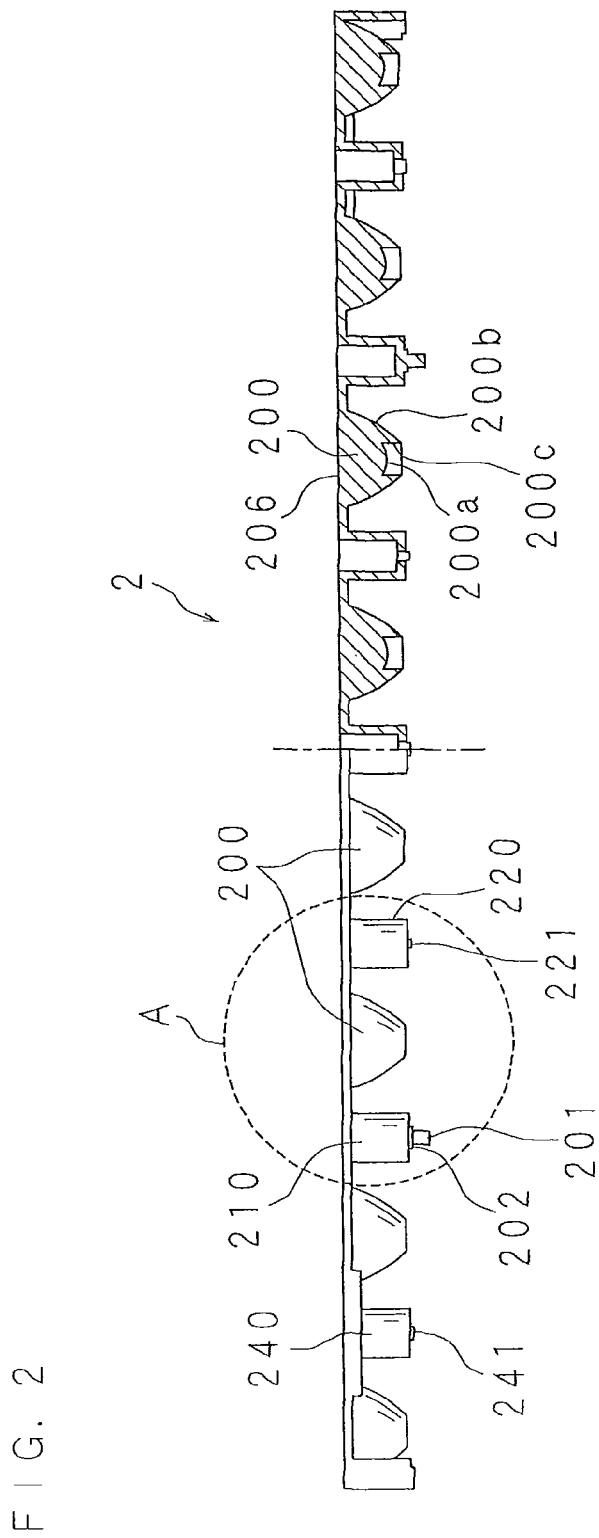
FIG. 2 is a front view of a lens body.
Figure 3:
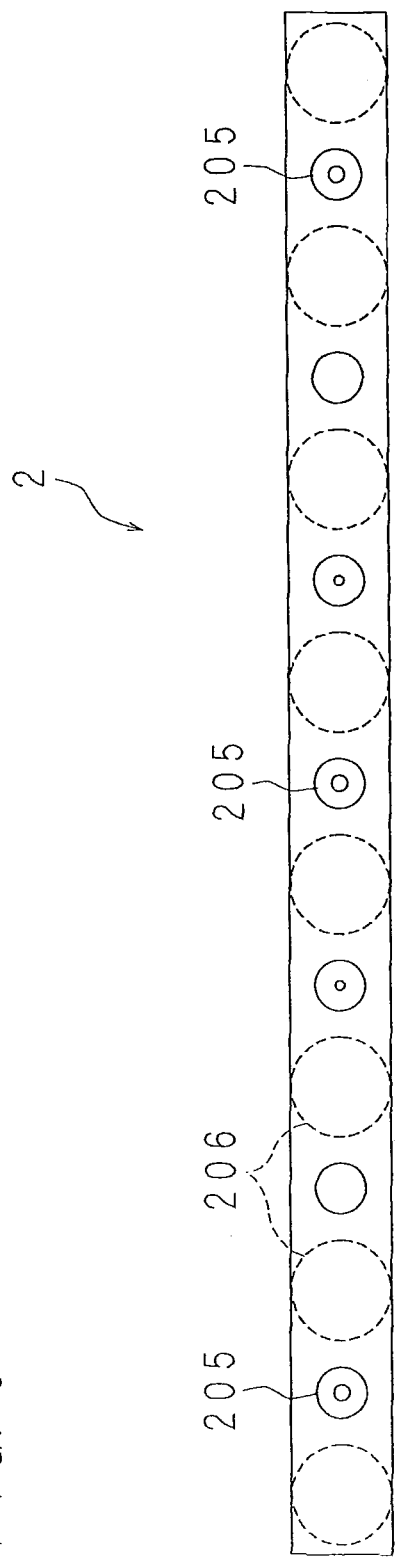
FIG. 3 is a top view of a lens body.

FIG. 2 is a front view of a lens body 2, FIG. 3 is a top view of a lens body 2, and FIG. 4 is a bottom view of a lens body 2. FIG. 2 illustrates a partial cross section of the lens body 2. As illustrated in FIG. 2, the lens body 2 is provided with lenses 200, which respectively have a substantially spherical convex shape, formed at an appropriate distance from each other in accordance with the mounting interval between light emitting diodes mounted on the substrate 1. It is to be noted that the present invention is not limited to a lens body 2 formed in an integrated fashion, and a lens body 2 may be constructed by forming respective units, which will be described later, as separate components and fixing the respective components with adhesive or the like.

Each lens 200 is provided with a convex lens part 200a, a reflector part 200b, a concave part 200c and the like. The convex lens part 200a is formed at a central bottom part of the lens 200 to condense light, which has a relatively small output angle, of light to be emitted from the light emitting diode. The concave part 200c is provided around the periphery of the convex lens part 200a to condense light, which has a relatively large output angle, of light to be emitted from the light emitting diode. Moreover, the reflector part 200b is formed inside the substantially spherical face of the lens 200 to reflect light, which has entered the lens 200 from the concave part 200c, to the top face of the lens 200. A diffuser part 206 for emitting light uniformly is formed at the top face of the lens 200. It is to be noted that the diffuser part 206 may be formed in the form of minute asperity, for example, though the diffuser part 206 is not essential.

Substantially cylindrical supporting units 210 and 220 are formed as adjusting units at both sides of the lens 200. The supporting units 210 and 220 are designed to adjust the separation distance between the lens 200 and the surface of the substrate 1 depending on the shape or size of the light emitting diode mounted on the substrate 1 (especially the height dimension of the light emitting diode from the substrate face), in the process of fixing the lens body 2 to the substrate 1.

A cylindrical convex part 202 is formed at a part of the end face (a top face) of the supporting unit 210 in a concentric fashion relative to the supporting unit 210, and a cylindrical positioning unit 201 is formed at a part of the tip face of the convex part 202 in a concentric fashion. The positioning unit 201 functions as a member for positioning in the process of fixing the substrate 1 and the lens body 2 to each other. Moreover, substantially rectangular convex parts 221 and 241 are formed respectively at a part of the tip face of supporting units 220 and 240.

The tip faces of the supporting units 210, 220 and 240 function as a first contacting face to come into contact with the surface of the substrate 1, and the tip faces of the convex part 202 and the substantially rectangular convex parts 221 and 241 function as a second contacting face to come into contact with the surface of the substrate 1, both making up a plurality of contacting faces having a step. It is to be noted that three or more contacting faces may be provided by further providing a step, though the example illustrated in the figure has two contacting faces.

Moreover, as illustrated in FIG. 3, tapped holes 205 for fixing the lens body 2 to the substrate 1 and the radiator frame 3 are formed in the vicinity of the center and both end parts of the lens body 2.

Figure 5A:
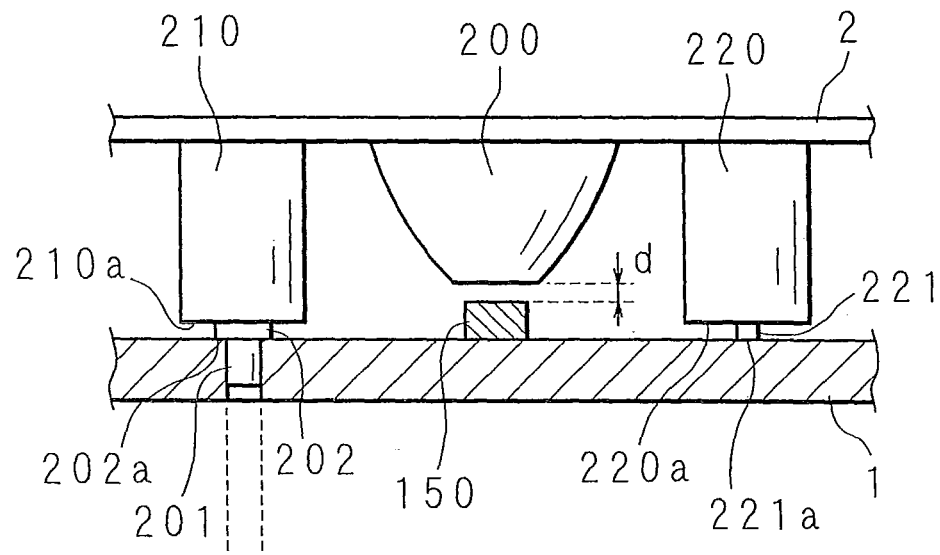
FIGS. 5A and 5B are an explanatory diagram for illustrating a state where a lens body is fixed to a substrate.
Figure 5B:
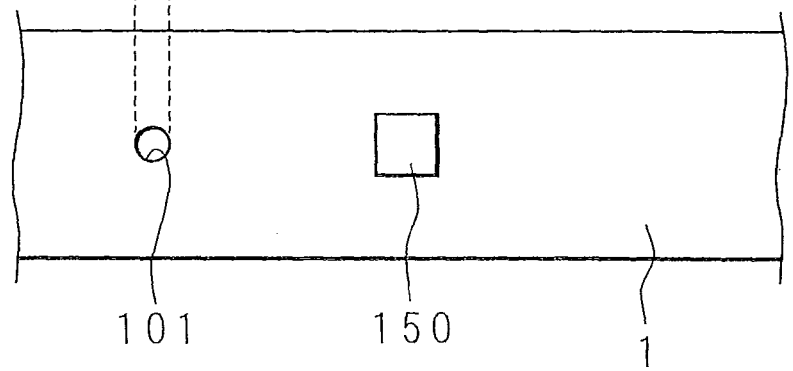
Figure 6A:
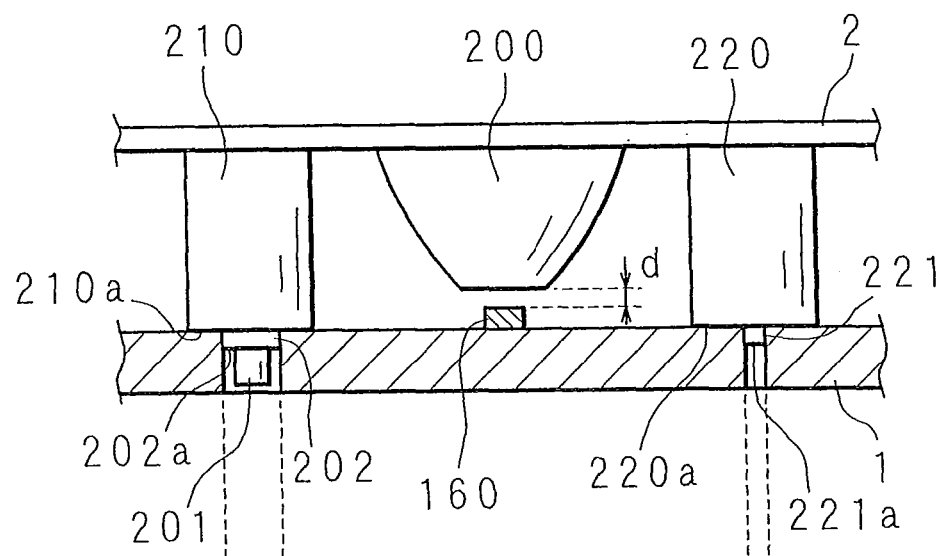
FIGS. 6A and 6B are an explanatory diagram for illustrating a state where a lens body is fixed to a substrate.
Figure 6B:
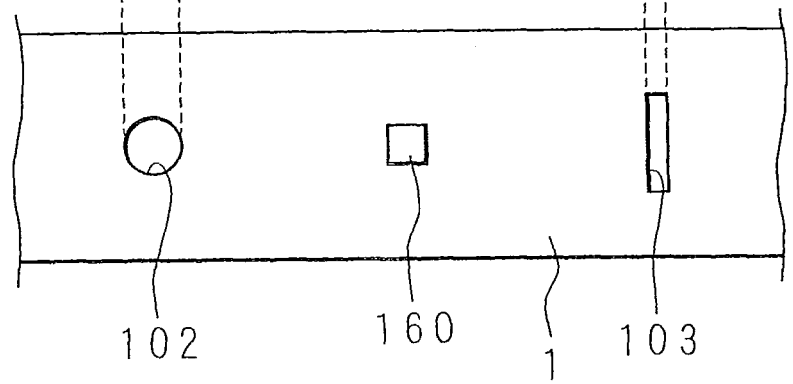

FIGS. 5 and 6 are explanatory diagrams for illustrating a state where the lens body 2 is fixed to the substrate 1. Both of FIGS. 5 and 6 are obtained by enlarging the part indicated by the "A" mark in FIG. 2. Moreover, FIG. 5A illustrates an example where the height dimension of a light emitting diode 150 is relatively large, while FIG. 6A illustrates an example where the height dimension of a light emitting diode 160 is smaller than the case illustrated in FIG. 5. Moreover, FIGS. 5B and 6B illustrate examples of the substrate 1 as seen from the top face (each mounting face of the light emitting diodes 150 and 160).

As illustrated in FIG. 5, a contacting face (a second contacting face) 202a of the convex part 202 formed at a part of a contacting face (a first contacting face) 210a of the supporting unit 210, and a contacting face (a second contacting face) 221a of the convex part 221 formed at a part of a contacting face (a first contacting face) 220a of the supporting unit 220 are respectively in contact with the surface of the substrate 1. That is, the attachment interval between the lens body 2 and the surface of the substrate 1 can be adjusted to be a desired length by using the height dimension of the supporting unit 210 and the convex part 202 and the height dimension of the supporting unit 220 and the convex part 221.

Moreover, when the positioning unit 201 is inserted in a hole 101 provided at the substrate 1, the positioning unit 201 is fitted with the hole 101, so that the substrate 1 and the lens body 2 are positioned in such a manner that the tip part of the lens 200 faces the surface of the emitting diode 150. It is to be noted that the shape of the hole 101 is not limited to a circular shape and can be various shapes such as a rectangular shape, a triangular shape and an ellipsoidal shape, as long as the hole 101 can be fitted with the positioning unit 201.

A separation distance d between the tip part of the lens 200 and the surface of the light emitting diode 150 can be set in a state where the substrate 1 and the lens body 2 are attached to each other. Consequently, the lens 200 can condense light to be emitted from the light emitting diode 150 in an intended state.

As illustrated in FIG. 6, when the lens body 2 is attached to a substrate 1 on which the light emitting diode 160 having a height smaller than the case illustrated in FIG. 5 is mounted, the contacting face (a first contacting face) 210a of the supporting unit 210 and the contacting face (a first contacting face) 220a of the supporting unit 220 are respectively in contact with the surface of the substrate 1. That is, the attachment interval between the lens body 2 and the surface of the substrate 1 can be adjusted to be shorter by a difference between the height of the light emitting diode 150 and the height of the light emitting diode 160, by using the height dimension of the supporting unit 210 and the height dimension of the supporting unit 220.

Moreover, when the convex parts 202 and 221 are respectively inserted in holes 102 and 103 provided at the substrate 1, the convex part 202 is fitted with the hole 102 and the convex part 221 is fitted with the hole 103, so that the substrate 1 and the lens body 2 are positioned in such a manner that the tip part of the lens 200 faces the surface of the light emitting diode 160. It is to be noted that the holes 102 and 103 may have any shape, as long as the holes 102 and 103 can be fitted respectively with the convex parts 202 and 221.

The rectangular convex part 241 formed at the tip face of the supporting unit 240 functions as with the rectangular convex part 221 formed at the tip face of the supporting unit 220. The supporting unit 240 also has a function for inserting a screw in the tapped hole 205 so as to attach the lens body 2 and the substrate 1 to the radiator frame 3. The convex part 241 may have any proper shape for the purpose of adjusting the attachment interval between the lens body 2 and the surface of the substrate 1, though the convex part 241 is formed to have a rectangular shape for the purpose of attaching the lens body 2 and the substrate 1 to the radiator frame 3. The following description will explain the reason for using a rectangular convex part 241, by comparing a rectangular convex part with a circular convex part.

Figure 7A:
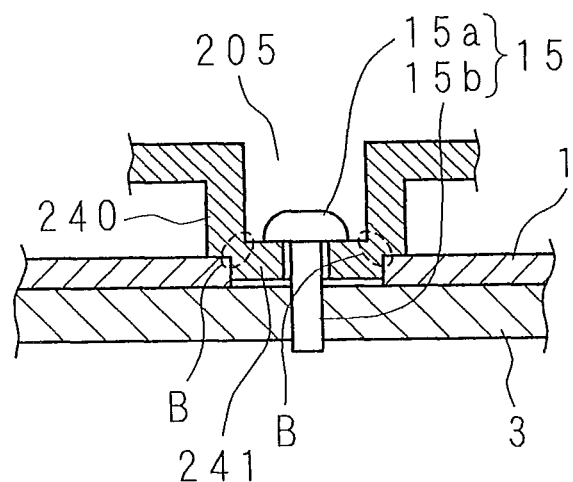
FIGS. 7A and 7B are an explanatory diagram for illustrating a state where a convex part is formed to have a circular shape.

FIG. 7 is an explanatory diagram for illustrating a state where the convex part 241 is formed to have a circular shape. As illustrated in FIG. 7A, the tapped hole 205 is formed at the supporting unit 240, and a screw 15 is inserted in the tapped hole 205 so that the lens body 2 is fixed to the substrate 1 and the lens body 2 and the substrate 1 are fixed to the radiator frame 3. The screw 15 has a head part 15a and a thread part 15b. The screw 15 is an M3 pan head screw, for example, and the diameter of the head part 15a is 5.6 mm and the diameter of the thread part 15b is 3 mm in such a case. Moreover, a hole (having a diameter of 3.6 mm, for example) for inserting the thread part 15b therein is formed at the convex part 241. Moreover, the diameter of the convex part 241 requires a sufficient dimension for inserting the thread part 15b therein and may be 7.6 mm, for example.

When the screw 15 is tightened at the radiator frame 3 under a general condition described above and there is no clearance between the tip face of the convex part 241 and the radiator frame 3, it is impossible to secure the substrate 1 with the lens body 2 and a clearance is formed between the substrate 1 and the radiator frame 3, and therefore a sufficient heat radiation effect may not be achieved. A proper clearance is therefore provided between the tip face of the convex part 241 and the radiator frame 3 when the screw 15 is tightened. However, since the diameter of a part where a clearance is provided, i.e., the diameter of the convex part 241 is larger than the diameter of the head part 15a of the screw 15, stress to be caused by tightening the screw 15 is concentrated on the part indicated by B in FIG. 7A, and the lens body 2 may possibly be damaged.

Figure 7B:
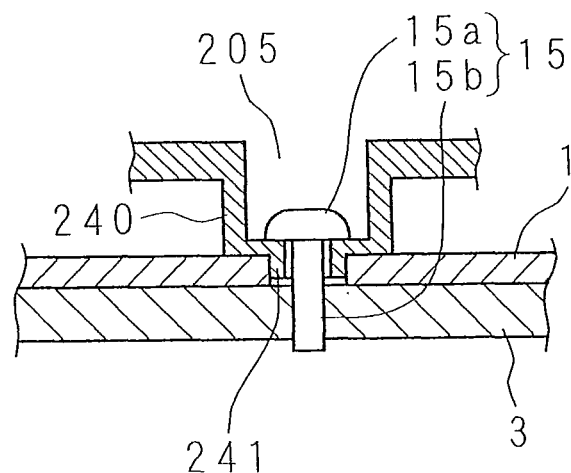

Moreover, even when concentration of stress can be inhibited by setting the diameter of the convex part 241 smaller than the diameter (e.g., 5.6 mm) of the head part 15a as illustrated in FIG. 7B in order to prevent the damage by tightening the screw, the thickness of the convex part 241 becomes smaller than 1 mm and the strength of the convex part 241 becomes insufficient since the diameter of the hole for inserting the screw 15 therein is 3.6 mm, for example.

The problems described above can be solved by forming the convex part 241 to have a rectangular shape.

FIGS. 8 and 9 are explanatory diagrams for illustrating a state where the convex part 241 is formed to have a rectangular shape. FIG. 8 corresponds to an example where the height dimension of the light emitting diode 150 is relatively large, while FIG. 9 corresponds to an example where the height dimension of the light emitting diode 160 is small.

Figure 8A:
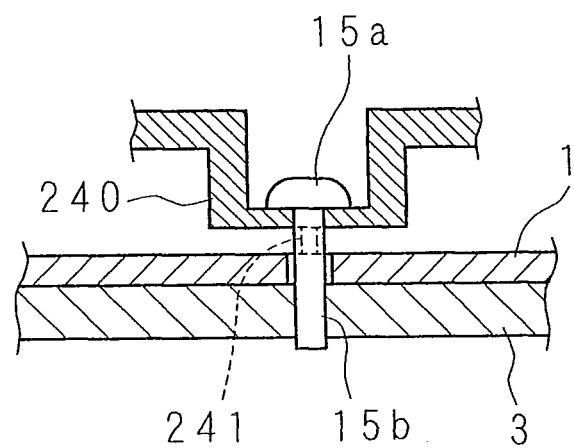
FIGS. 8A and 8B are an explanatory diagram for illustrating a state where a convex part is formed to have a rectangular shape.
Figure 8B:
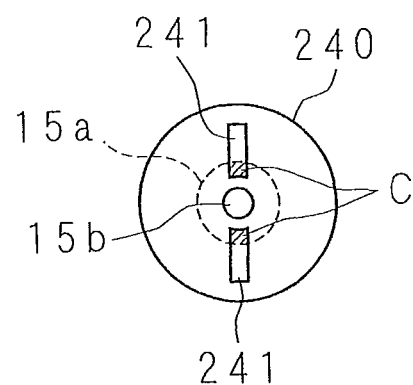

When the height dimension of the light emitting diode 150 is relatively large, the tip face of the convex part 241 is in contact with the surface of the substrate 1 as illustrated in FIG. 8A. FIG. 8B illustrates an example of the convex part 241 in the state of FIG. 8A as seen from the tip face side, wherein the substrate 1 and the radiator frame 3 are omitted. By forming the convex part 241 to have a rectangular shape, it becomes possible to accept the clamping force of the screw 15 with the part of the area C indicated by a broken line as illustrated in FIG. 8B and to inhibit concentration of stress to be generated at the lens body 2.

Figure 9A:
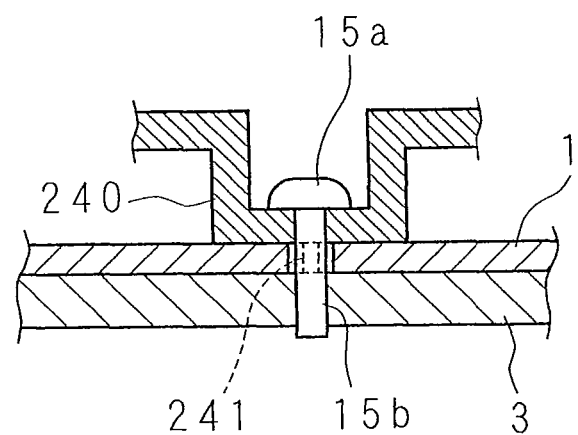
FIGS. 9A and 9B are an explanatory diagram for illustrating a state where a convex part is formed to have a rectangular shape.
Figure 9B:
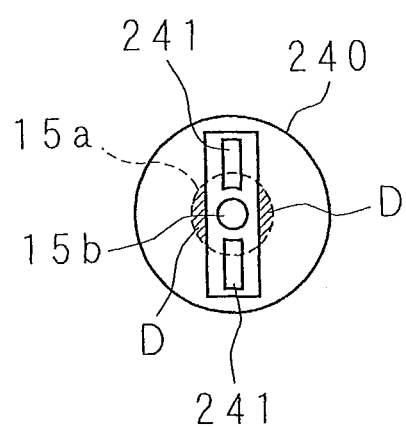

Moreover, when the height dimension of the light emitting diode 160 is relatively small, the tip face of the supporting unit 240 is in contact with the surface of the substrate 1 as illustrated in FIG. 9A. FIG. 9B illustrates an example of the convex part 241 in the state of FIG. 9A as seen from the tip face side, wherein the substrate 1 and the radiator frame 3 are omitted. It is to be noted that the rectangle surrounding the convex part 241 and the thread part 15b in FIG. 9B schematically illustrates a fit hole, which is formed at the substrate 1 to be fitted with the convex part 241. By forming the convex part 241 to have a rectangular shape, it becomes possible to accept the clamping force of the screw 15 with the part of the area D indicated by a broken line as illustrated in FIG. 9B and to inhibit concentration of stress to be generated at the lens body 2. Moreover, since the thickness of the convex part 241 can be equal to or larger than 2 mm, it is possible to ensure sufficient strength and to improve strength poverty.

A separation distance d between the tip part of the lens 200 and the surface of the light emitting diode 160 can be set in a state where the substrate 1 and the lens body 2 are attached to each other. Consequently, it is possible to maintain a substantially equal separation distance between the tip part of the lens 200 and the surface of the light emitting diodes 150 and 160 in both cases illustrated in FIGS. 5 and 6, and the lens 200 can condense light to be emitted from the light emitting diode 160 in an intended state.

It is to be noted that the present invention is not limited to the examples illustrated in FIGS. 5 and 6 wherein holes for fitting 101, 102, 103 and the like formed at the substrate 1 are used for fitting the lens body 2 with the substrate 1, and holes for fitting may be provided at, for example, a chassis or a housing fixed to the substrate so that the attachment dimension of the lens body 2 and the surface of the chassis or the housing can be adjusted.

Figure 10:
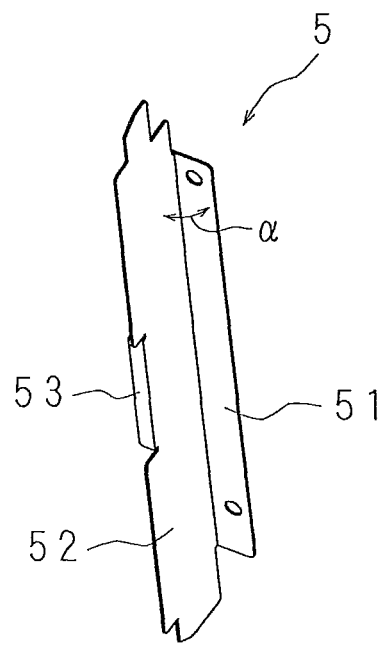
FIG. 10 is an outline perspective view of a side plate.
Figure 11:
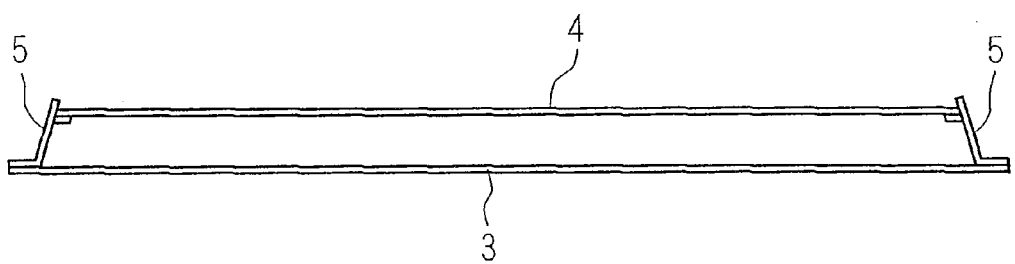
FIG. 11 is a schematic diagram for illustrating an attachment state of a cover.

FIG. 10 is an outline perspective view of a side plate 5, and FIG. 11 is a schematic diagram for illustrating an attachment state of the cover 4. The side plate 5 is made of metal and is provided with: a rectangular fixed part 51 to be fixed to the radiator frame 3; a standing part 52 bent from the fixed part 51 in a substantially L shape; and a stage part 53, which is formed by folding the center of an edge part of the standing part 52 and on which an end part of the cover 4 is laid. Moreover, the standing part 52 is formed to slant inward (having an angle α equal to or larger than 90 degrees in the example illustrated in FIG. 10) in a state where the side plates 5 and 5 are fixed to the radiator frame 3 as illustrated in FIG. 11, and it is possible to prevent the effect of attachment error of the cover 4 by pressing end parts of the cover 4 with the respective standing parts 52 and to attach the cover 4 reliably without a backlash.

Embodiment 2

The present invention is not limited to Embodiment 1 described above wherein two types of supporting units 210 and 220 are provided to adjust the attachment dimension of the substrate 1 and the lens body 2, and only one type of a supporting unit may be provided.

Figure 12A:
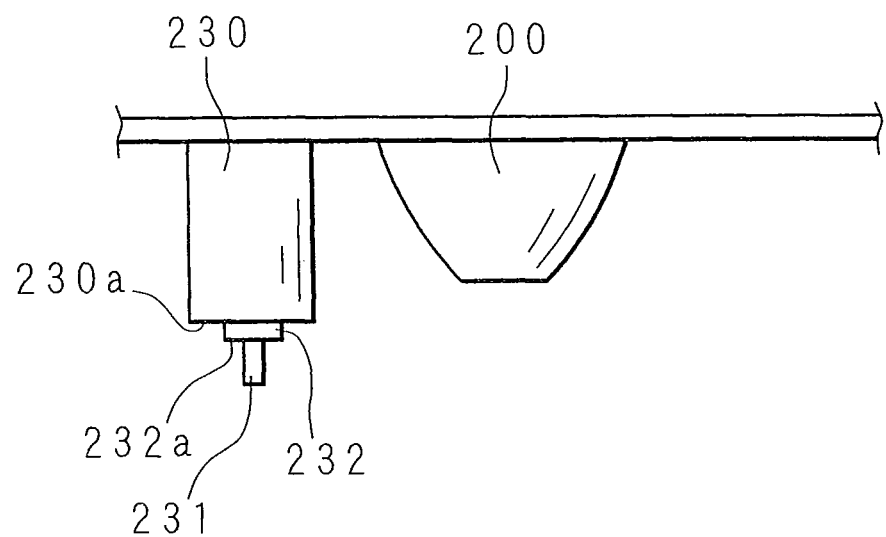
FIGS. 12A and 12B are an outline view of a main part of a lens body of Embodiment 2.
Figure 12B:
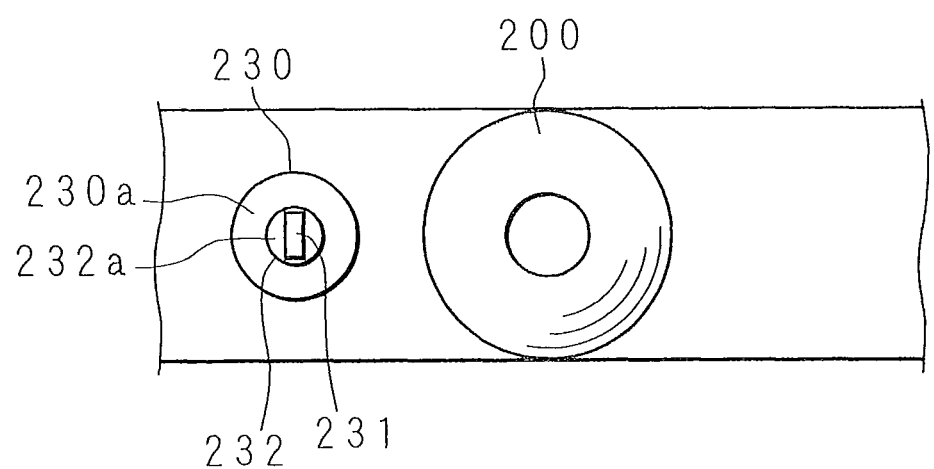

FIG. 12 is an outline view of a main part of a lens body 2 of Embodiment 2. FIG. 12A illustrates a front view of a main part of the lens body 2, and FIG. 12B illustrates a bottom view of a main part of the lens body 2. As illustrated in FIG. 12, a cylindrical convex part 232 is formed at a part of a contacting face (a first contacting face) 230a of a cylindrical supporting unit 230, which functions as an adjusting unit, in a concentric fashion. Moreover, a positioning unit 231 is formed at a part of a contacting face (a second contacting face) 232a of the convex part 232. The positioning unit 231 has a substantially rectangular planar shape. It is to be noted that the planar shapes of the convex potion 232 and the positioning unit 231 are not limited to the ones described above. It is also to be noted that supporting units may be formed at both sides of the lens 200, though a supporting unit 230 is formed at one side of the lens 200 in FIG. 12. The number of supporting units 230 and the separation distance can be set properly depending on the shape or size of the substrate 1.

Figure 13A:
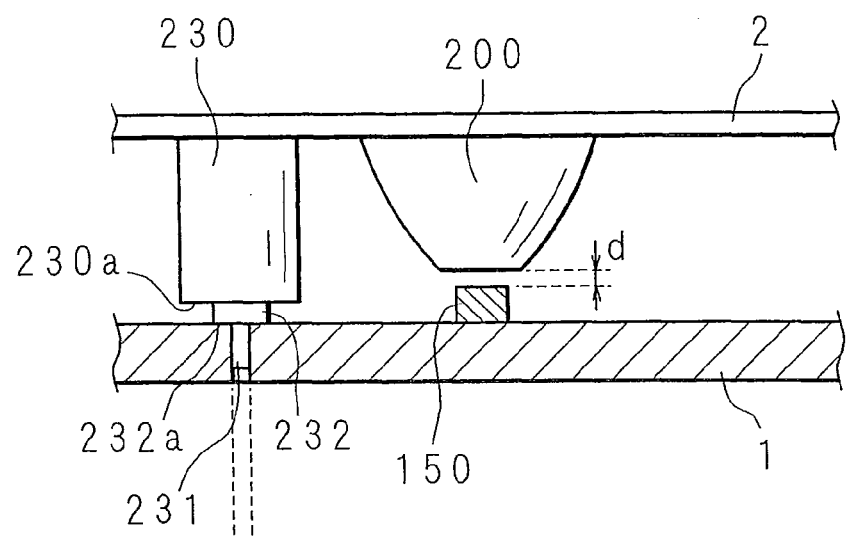
FIGS. 13A and 13B are an explanatory diagram for illustrating a state where a lens body is fixed to a substrate.
Figure 13B:
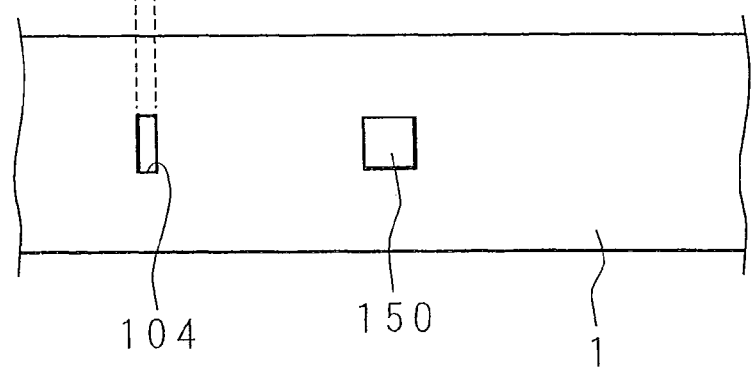
Figure 14A:
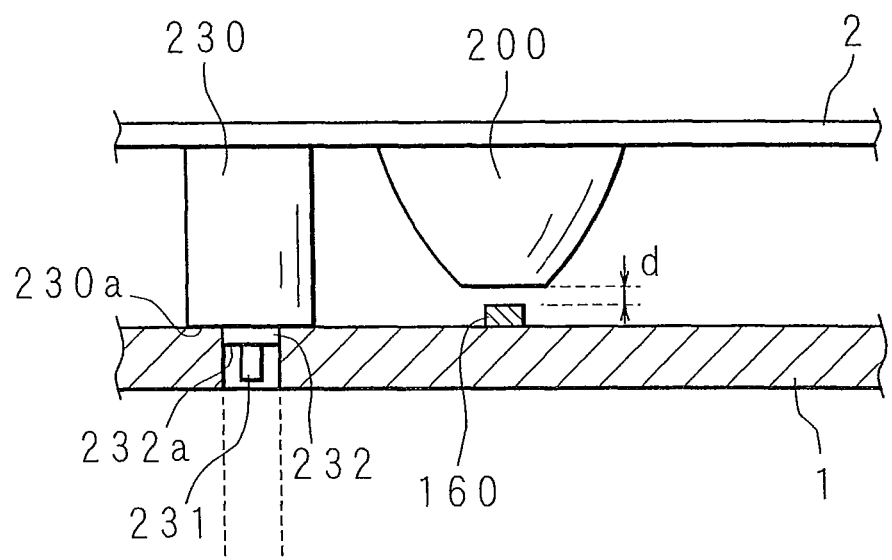
FIGS. 14A and 14B are an explanatory diagram for illustrating a state where a lens body is fixed to a substrate.
Figure 14B:
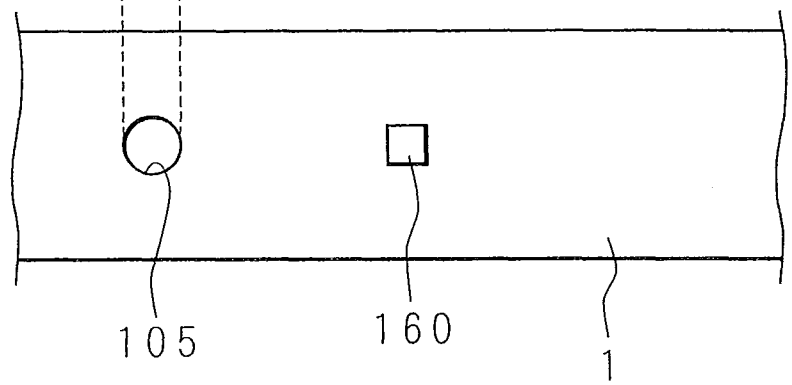
Figure 17A:
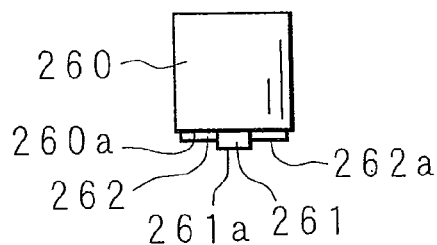
FIGS. 17A to 17E are a schematic diagram for illustrating an example of multistage adjustment of a separation distance.
Figure 17C:
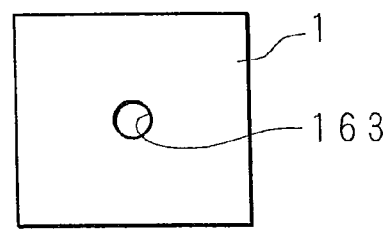
Figure 17B:
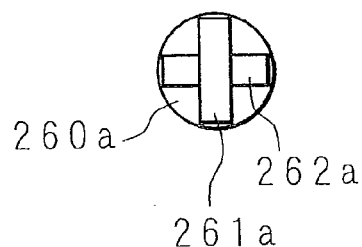
Figure 17D:
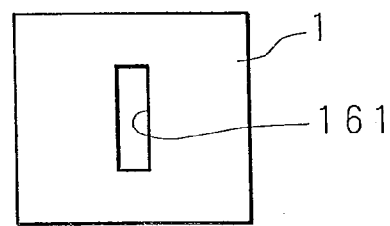
Figure 17E:
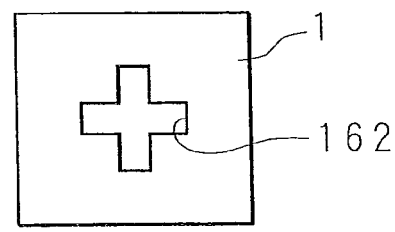
Figure 18A:
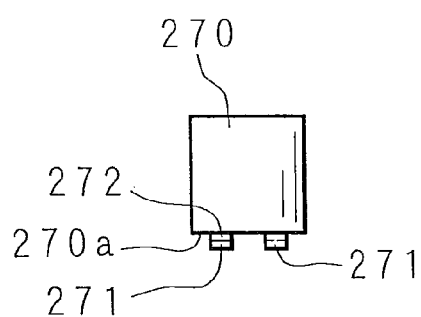
FIGS. 18A to 18E are a schematic diagram for illustrating another example of multistage adjustment of a separation distance.
Figure 18B:
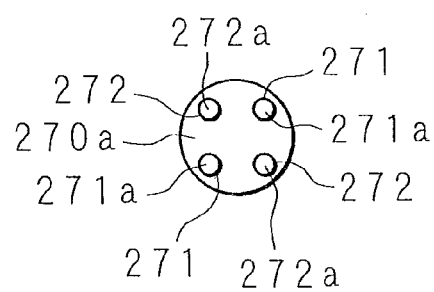
Figure 18C:
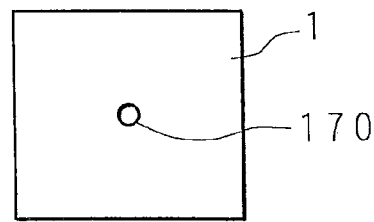
Figure 18D:
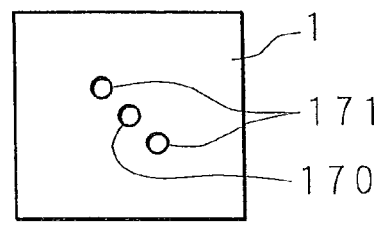
Figure 18E:
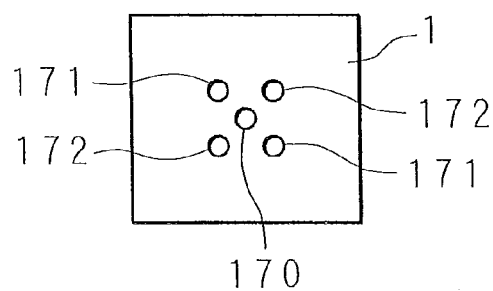

FIGS. 13 and 14 are explanatory diagrams for illustrating a state where the lens body 2 is fixed to the substrate 1. FIG. 13A illustrates an example where the height dimension of a light emitting diode 150 is relatively large, while FIG. 14A illustrates an example where the height dimension of a light emitting diode 160 is smaller than the case illustrated in FIG. 13. Moreover, FIGS. 13B and 14B illustrate examples of the substrate 1 as seen from the top face (each mounting face of the light emitting diodes 150 and 160).

As illustrated in FIG. 13, the contacting face (a second contacting face) 232a of the convex part 232 formed at a part of the contacting face (a first contacting face) 230a of the supporting unit 230 is in contact with the surface of the substrate 1. That is, the attachment interval between the lens body 2 and the surface of the substrate 1 can be adjusted to be a desired length by using the height dimension of the supporting unit 230 and the convex part 232.

Moreover, when the positioning unit 231 is inserted in a hole 104 provided at the substrate 1, the positioning unit 231 is fitted with the hole 104, so that the substrate 1 and the lens body 2 are positioned in such a manner that the tip part of the lens 200 faces the surface of the light emitting diode 150. It is to be noted that the shape of the hole 104 is not limited to a rectangular shape and may be another shape, as long as the hole 104 can be fitted with the positioning unit 231.

A separation distance d between the tip part of the lens 200 and the surface of the light emitting diode 150 can be set in a state where the substrate 1 and the lens body 2 are attached to each other. Consequently, the lens 200 can condense light to be emitted from the light emitting diode 150 in an intended state.

As illustrated in FIG. 14, when the lens body 2 is attached to a substrate 1 on which the light emitting diode 160 having a height smaller than the case illustrated in FIG. 13 is mounted, the contacting face (a first contacting face) 230a of the supporting unit 230 is in contact with the surface of the substrate 1. That is, the attachment interval between the lens body 2 and the surface of the substrate 1 can be adjusted to be shorter by a difference between the height of the light emitting diode 150 and the height of the light emitting diode 160, by using the height dimension of the supporting unit 230.

Moreover, when the convex part 232 is inserted in a hole 105 provided at the substrate 1, the convex part 232 is fitted with the hole 105, so that the substrate 1 and the lens body 2 are positioned in such a manner that the tip part of the lens 200 faces the surface of the light emitting diode 160. It is to be noted that the hole 105 may have any shape, as long as the hole 105 can be fitted with the convex part 232.

A separation distance d between the tip part of the lens 200 and the surface of the light emitting diode 160 can be set in a state where the substrate 1 and the lens body 2 are attached to each other. Consequently, it is possible to maintain a substantially equal separation distance between the tip part of the lens 200 and the surface of the light emitting diodes 150 and 160 in both cases illustrated in FIGS. 13 and 14, and the lens 200 can condense light to be emitted from the light emitting diode 160 in an intended state.

Embodiment 3

The present invention is not limited to Embodiment 1 described above wherein two types of supporting units 210 and 220 are provided to adjust the attachment dimension of the substrate 1 and the lens body 2, and three types of supporting units may be provided.

FIGS. 15 and 16 are explanatory diagrams for illustrating a state where a lens body 2 of Embodiment 3 is fixed to a substrate 1. FIG. 15A illustrates an example where the height dimension of a light emitting diode 150 is relatively large, while FIG. 16A illustrates an example where the height dimension of a light emitting diode 160 is smaller than the case illustrated in FIG. 15. Moreover, FIGS. 15B and 16B illustrate examples of the substrate 1 as seen from the top face (each mounting face of the light emitting diodes 150 and 160).

A convex part 241, which has a dimension substantially equal to the diameter of a supporting unit 240 and has a rectangular planar view, is formed at a part of the end face (a top face) of the supporting unit 240, which functions as an adjusting unit. It is to be noted that supporting units 210 and 220 are the same as those in Embodiment 1, and explanation thereof is omitted.

As illustrated in FIG. 15, a contacting face (a second contacting face) 202a of a convex part 202 formed at a part of a contacting face (a first contacting face) 210a of the supporting unit 210, a contacting face (a second contacting face) 221a of a convex part 221 formed at a part of a contacting face (a first contacting face) 220a of the supporting unit 220, and a contacting face (a second contacting face) 241a of the convex part 241 formed at a part of a contacting face (a first contacting face) 240a of the supporting unit 240 are respectively in contact with the surface of the substrate 1. That is, the attachment interval between the lens body 2 and the surface of the substrate 1 can be adjusted to be a desired length by using the height dimension of the supporting unit 210 and the convex part 202, the height dimension of the supporting unit 220 and the convex part 221, and the height dimension of the supporting unit 240 and the convex part 241.

Moreover, when a positioning unit 201 is inserted in a hole 101 provided at the substrate 1, the positioning unit 201 is fitted with the hole 101, so that the substrate 1 and the lens body 2 are positioned in such a manner that the tip part of the lens 200 faces the surface of the light emitting diode 150. It is to be noted that the shape of the hole 101 is not limited to a circular shape and can be various shapes such as a rectangular shape, a triangular shape and an ellipsoidal shape, as long as the hole 101 can be fitted with the positioning unit 201. It is also to be noted that holes for positioning 106 and 107 may be formed at the substrate 1. In such a case, a projection part for positioning can be provided at each of the end faces of the convex parts 241 and 221.

A separation distance d (substantially 0 in the example illustrated in FIG. 15) between the tip part of the lens 200 and the surface of the light emitting diode 150 can be set in a state where the substrate 1 and the lens body 2 are attached to each other. Consequently, the lens 200 can condense light to be emitted from the light emitting diode 150 in an intended state.

As illustrated in FIG. 16, when the lens body 2 is attached to a substrate 1 on which a light emitting diode 160 having a height smaller than the case illustrated in FIG. 15 is mounted, the contacting face (a first contacting face) 210a of the supporting unit 210, the contacting face (a first contacting face) 220a of the supporting unit 220 and the contacting face (a first contacting face) 240a of the supporting unit 240 are respectively in contact with the surface of the substrate 1. That is, the attachment interval between the lens body 2 and the surface of the substrate 1 can be adjusted to be shorter by a difference between the height of the light emitting diode 150 and the height of the light emitting diode 160, by using the height dimension of the supporting units 210, 220 and 240.

Moreover, when the convex parts 202, 221 and 241 are respectively inserted in holes 102, 103 and 108 provided at the substrate 1, the convex part 202 is fitted with the hole 102, the convex part 221 is fitted with the hole 103 and the convex part 241 is fitted with the hole 108, so that the substrate 1 and the lens body 2 are positioned in such a manner that the tip part of the lens 200 faces the surface of the light emitting diode 160. It is to be noted that the holes 102, 103 and 108 may have any shape, as long as the holes 102, 103 and 108 can be fitted respectively with the convex parts 202, 221 and 241.

A separation distance d (substantially 0 in the example illustrated in FIG. 16) between the tip part of the lens 200 and the surface of the light emitting diode 160 can be set in a state where the substrate 1 and the lens body 2 are attached to each other. Consequently, it is possible to maintain a substantially equal separation distance between the tip part of the lens 200 and the surface of the light emitting diodes 150 and 160 in both cases illustrated in FIGS. 15 and 16, and the lens 200 can condense light to be emitted from the light emitting diode 160 in an intended state.

Embodiment 4

The present invention is not limited to the embodiments described above wherein the separation distance between the tip part of a lens 200 and the surface of a light emitting diode is adjusted by two-stage adjustment, and multistage adjustment having three or more stages can be applied. The following description will explain a case where the separation distance is adjusted in three stages as an example of multistage adjustment, though four or more stages can be also constructed in a similar fashion.

FIG. 17 is a schematic diagram for illustrating an example of multistage adjustment of a separation distance. FIGS. 17A and 17B respectively illustrate a front view and a bottom view of a supporting unit 260 formed at a lens body 2, and FIGS. 17C to 17E illustrate plan views of a main part of three types of substrates corresponding to the dimensions (heights) of light emitting diodes.

A convex part 261, which has a dimension substantially equal to the diameter of the supporting unit 260 and has a rectangular planar view, is formed at a part of the end face (a top face) of the supporting unit 260, which functions as an adjusting unit. Moreover, a convex part 262, which has a dimension substantially equal to the diameter of the supporting unit 260 and has a rectangular planar view, is formed at a part of the end face of the supporting unit 260 so as to be perpendicular to the convex part 261. The thickness (a height dimension) of the convex part 262 is smaller than the thickness of the convex part 261. It is to be noted that a projection (having a cylindrical shape, for example) for positioning may be provided at a central part of the end face of the convex part 261.

When the dimension (e.g., a height) of a light emitting diode is large, a substrate 1 provided with a hole for positioning 163 is used. In such a case, the separation distance between the tip part of a lens 200 and the surface of a light emitting diode is maximized by bringing a contacting face 261a of the convex part 261 into contact with the surface of the substrate 1.

When the dimension (e.g., a height) of a light emitting diode is medium, a substrate 1 provided with a rectangular hole 161 is used. In such a case, the separation distance between the tip part of a lens 200 and the surface of a light emitting diode is set to be medium by fitting a part of the convex part 261 with the hole 161 and bringing a contacting face 262a of the convex part 262 into contact with the surface of the substrate 1.

When the dimension (e.g., a height) of a light emitting diode is small, a substrate 1 provided with a hole 162 having a substantially cross shape is used. In such a case, the separation distance between the tip part of a lens 200 and the surface of a light emitting diode is minimized by fitting the convex parts 261 and 262 with the hole 162 and bringing a contacting face 260a of the supporting unit 260 into contact with the surface of the substrate 1.

FIG. 18 is a schematic diagram for illustrating another example of multistage adjustment of a separation distance. FIGS. 18A and 18B respectively illustrate a front view and a bottom view of a supporting unit 270 formed at a lens body 2, and FIGS. 18C to 18E illustrate plan views of a main part of three types of substrates corresponding to the dimensions (heights) of light emitting diodes.

Cylindrical convex parts 271, 271, 272 and 272 are formed at the end face (a top face) of the supporting unit 270, which functions as an adjusting unit, at an appropriate distance from each other. The height of the convex parts 272 is smaller than that of the convex parts 271. It is to be noted that a projection (having a cylindrical shape, for example) for positioning may be provided at a central part of the end face of the supporting unit 270.

When the dimension (e.g., a height) of a light emitting diode is large, a substrate 1 provided with a hole for positioning 170 is used. In such a case, the separation distance between the tip part of a lens 200 and the surface of a light emitting diode is maximized by bringing a contacting face 271a of the convex part 271 into contact with the surface of the substrate 1.

When the dimension (e.g., a height) of a light emitting diode is medium, a substrate 1 provided with holes 170 and 171 is used. In such a case, the separation distance between the tip part of a lens 200 and the surface of a light emitting diode is set to be medium by fitting the convex part 271 with the hole 171 and bringing a contacting face 272*a* of the convex part 272 into contact with the surface of the substrate 1.

When the dimension (e.g., a height) of a light emitting diode is small, a substrate 1 provided with holes 170, 171 and 172 is used. In such a case, the separation distance between the tip part of a lens 200 and the surface of a light emitting diode is minimized by fitting the convex parts 271 and 272 respectively with the holes 171 and 172 and bringing a contacting face 270*a* of the supporting unit 270 into contact with the surface of the substrate 1.

Embodiment 5

The present invention is not limited to the embodiments described above wherein a supporting unit is provided at a lens body 2 in order to adjust the attachment dimension of a substrate 1 and the lens body 2, and a supporting unit may be provided at the substrate 1 side.

Figure 19A:
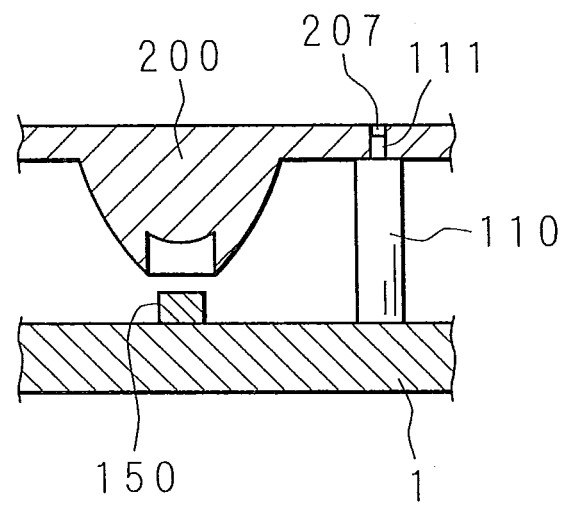
FIGS. 19A and 19B are an outline view of a main part of the periphery of a lens of Embodiment 5.
Figure 19B:
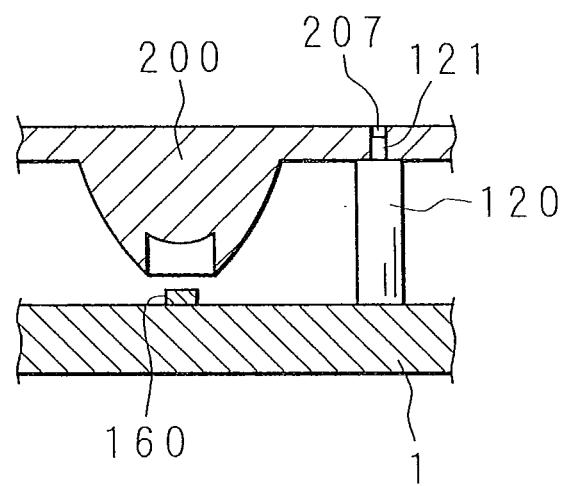

FIG. 19 is an outline view of a main part of the periphery of a lens 200 of Embodiment 5. FIG. 19A illustrates an example where the height dimension of a light emitting diode 150 is relatively large, while FIG. 19B illustrates an example where the height dimension of a light emitting diode 160 is smaller than the case illustrated in FIG. 19A. As illustrated in FIG. 19A, a supporting unit 110, which functions as an adjusting member, is provided at the mounting face of the substrate 1 in such a manner that the separation distance between the tip part of the lens 200 and the surface of the light emitting diode 150 can be set to a proper length. Moreover, a convex part 111 is provided at the tip face of the supporting unit 110 so as to be fitted with a hole 207 formed at the lens body 2.

As illustrated in FIG. 19B, a supporting unit 120, which has a length smaller than that of the supporting unit 110 and functions as an adjusting member, is provided at the mounting face of the substrate 1 in such a manner that the separation distance between the tip part of the lens 200 and the surface of the light emitting diode 160 can be set to a proper length when the lens body 2 is fixed to a substrate, on which the light emitting diode 160 having a small height dimension is mounted. Moreover, a convex part 121 is provided at the tip face of the supporting unit 120 so as to be fitted with the hole 207 formed at the lens body 2. A common lens body 2 can be used by forming the convex parts 111 and 121 to have the same shape.

The supporting units 110 and 120 may be dedicated members for adjusting the attachment interval between the lens body 2 and the surface of the substrate 1 to be a desired length, or may be components (e.g., resistors or connectors) to be mounted on the surface of the substrate 1. Moreover, the supporting units 110 and 120 may be components separate from the substrate 1 to be attached in the process of fixing the substrate 1 and the lens body 2 to each other.

As explained above, it is possible with the present invention to maintain a substantially equal separation distance between a lens and a light source regardless of the height of the light source from the installation face by adjusting the interval between the lens and the installation face and to emit light from the light source always in a predetermined direction, even when the height of each light source such as a light emitting diode from the installation face is different. There is therefore no need to use a different lens body depending on the shape or size of each light source, and it is possible to use a common lens body regardless of the shape or size of a light source and to reduce the cost.

Though the attachment interval between a predetermined face and a lens is adjusted in the embodiments described above by forming a convex part at the supporting unit side of a lens body to provide a plurality of contacting faces and providing a hole to be fitted with the convex part at the predetermined face side such as a substrate, the opposite structure may be employed. In other words, a convex part may be provided at the predetermined face side such as a substrate to form a plurality of contacting faces and a hole to be fitted with the convex part of the predetermined face may be provided at the supporting unit side of a lens body, so that the attachment interval between the predetermined face and the lens can be adjusted. That is, a convex part and a hole may be formed at any side, as long as an adjusting unit, which is composed of a convex part and a hole to be fitted with the convex part, is provided at a lens body and a predetermined face such as a substrate correspondingly.

Though an example using a light emitting diode as a light source has been explained in the embodiments described above, a light source is not limited to a light emitting diode and may be another light source such as an electric light bulb or a fluorescent light tube.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A lens body having a lens for condensing light from a light source wherein the lens is attached to face a surface of a substrate, comprising:
an adjusting unit for adjusting an attachment interval between the surface of the substrate and the lens; and
another adjusting unit having a tip face facing the surface of the substrate, wherein a tapped hole for inserting a screw fixed to a frame provided at a back of the substrate is formed at the another adjusting unit, and wherein the another adjusting unit includes a rectangular convex part at the tip face, positioned around the tapped hole.

2. The lens body according to claim 1, wherein the adjusting unit comprises:
a supporting unit to be in contact with the surface of the substrate for supporting the lens; and
a plurality of contacting faces having a step, which are provided at the supporting unit.

3. The lens body according to claim 2, wherein the adjusting unit comprises:
a convex part formed at a part of a first contacting face; and
a second contacting face formed at a tip face of the convex part.

4. The lens body according to claim 3, wherein the adjusting unit comprises a positioning unit, which is provided at a part of the second contacting face, for determining a location of the lens.

5. The lens body according to claim 1, wherein the lens and the adjusting unit are formed in an integrated fashion.

6. A light source unit comprising:
the lens body according to claim 1; and
a substrate, on which a light emitting device is mounted, wherein the adjusting unit is constructed to adjust an attachment interval between the lens and the substrate face, which functions as the surface of the substrate.

7. The light source unit according to claim 6, wherein the adjusting unit is constructed to adjust a separation distance between the lens and the surface of the light emitting device to be substantially constant relative to each substrate, on which the light emitting device having a different height is mounted.

8. The light source unit according to claim 6, wherein the substrate comprises a fit part to be fitted with any one of the convex part and the positioning unit depending on a height of the light emitting device mounted on the substrate.

9. A lighting system comprising:
the light source unit according to claim 6.

10. A lens body having a lens for condensing light from a light source wherein the lens is attached to face a surface of a substrate
comprising:
an adjusting unit capable of maintaining an equal interval between the lens and the light source by adjusting an attachment interval between the surface of the substrate and the lens depending on a type of the light source; and
another adjusting unit having a tip face facing the surface of the substrate, wherein a tapped hole for inserting a screw fixed to a frame provided at a back of the substrate is formed at the another adjusting unit, and wherein the another adjusting unit includes a rectangular convex part at the tip face, positioned around the tapped hole.

11. The lens body according to claim 10, wherein the adjusting unit comprises:
a supporting unit to be in contact with the surface of the substrate for supporting the lens; and
a plurality of contacting faces having a step, which are provided at the supporting unit.

12. The lens body according to claim 11, wherein the adjusting unit comprises:
a convex part formed at a part of a first contacting face; and
a second contacting face formed at a tip face of the convex part.

13. The lens body according to claim 12, wherein the adjusting unit comprises a positioning unit, which is provided at a part of the second contacting face, for determining a location of the lens.

14. The lens body according to claim 10, wherein the lens and the adjusting unit are formed in an integrated fashion.

15. A light source unit comprising:
the lens body according to claim 10; and
a substrate, on which a light emitting device is mounted,
wherein the adjusting unit is constructed to adjust an attachment interval between the lens and the substrate face, which functions as the surface of the substrate.

16. The light source unit according to claim 15, wherein the adjusting unit is constructed to adjust a separation distance between the lens and the surface of the light emitting device to be substantially constant relative to each substrate, on which the light emitting device having a different height is mounted.

17. The light source unit according to claim 15, wherein the substrate comprises a fit part to be fitted with any one of the convex part and the positioning unit depending on a height of the light emitting device mounted on the substrate.

18. A lighting system comprising:
the light source unit according to claim 15.

\* \* \* \* \*